United States Patent [19]

Van Voorhis

[11] 4,181,977
[45] Jan. 1, 1980

[54] RANDOM ACCESS BUBBLE MEMORY WITH UNIFIED READ/WRITE CYCLE

[75] Inventor: David C. Van Voorhis, Tampa, Fla.

[73] Assignee: International Business Machines Corporation, Armonk, N.Y.

[21] Appl. No.: 916,976

[22] Filed: Jun. 19, 1978

[51] Int. Cl.² ............................................. G11C 19/08
[52] U.S. Cl. ........................................... 365/4; 365/14
[58] Field of Search ...................................... 365/4, 14

[56] References Cited

U.S. PATENT DOCUMENTS

| 4,032,905 | 6/1977 | Chen | 365/4 |
| 4,085,451 | 4/1978 | Chen et al. | 365/4 |
| 4,128,894 | 12/1978 | Chen | 365/4 |

*Primary Examiner*—James W. Moffitt
*Attorney, Agent, or Firm*—Joseph E. Kieninger

[57] ABSTRACT

A random access bubble memory directs a plurality of continuous streams of bubbles toward a plurality of storage loops. A write decoder selects one continuous stream of bubbles. An annihilator then transforms this one continuous stream of bubbles into the desired data pattern which is then stored in a selected loop. While the data pattern is being formed, a read decoder directs the data which had been stored in the selected loop to a bubble detector. This memory has a unified read/write cycle which permits intermixed read and write, read/modify/write, and swap operations. This bubble memory allows a user to remove power abruptly during a read/write cycle without returning a partially processed block to its storage loop and without saving the identity of the block. In a preferred embodiment, the read and write decoders are operated simultaneously by identical control currents.

8 Claims, 4 Drawing Figures

RANDOM ACCESS BUBBLE MEMORY WITH UNIFIED READ/WRITE CYCLE

DESCRIPTION

Technical Description

This invention relates to a bubble memory system and more particularly to a random access bubble memory with unified read/write cycle.

It is a primary object of this invention to provide an improved bubble memory.

It is another object of this invention to provide an improved random access bubble memory.

It is still another object of this invention to provide a random access bubble memory with unified read/write cycle.

It is yet still another object of this invention to provide a random access bubble memory which permits intermixed read and write, read/modify/write, and swap operations.

It is a further object of this invention to provide a random access bubble memory that allows a user to remove power abruptly during a read/write cycle without returning a partially processed block to its storage loop and without saving the identity of the block.

It is a still further object of this invention to provide a random access bubble memory that has a write operation that is not more time consuming than a read operation.

BACKGROUND ART

Bubble chip memory systems are termed random access when they permit any individual loop to be selected temporarily for a read or write operation. A number of random access bubble memory systems have been reported which have different physical and functional differences which will be discussed below.

The patent to Chang et al U.S. Pat. No. 3,701,125 and assigned to the assignee of the present invention, describes a random access organization having the following three operations; (a) a general clear operation that removes all bubbles from the data loops, (b) a write operation that writes new data into a selected loop, and (c) a non-destructive read operation that reads non-destructively the data in any selected loop. This organization is termed "read mostly" since the data in any loop can be read non-destructively as often as desired, while the data in a loop can be updated or rewritten only after the entire memory has been cleared. This is because new data encoded by the presence or absence of bubbles cannot be merged on top of old data, and no loop can be individually cleared to make room for new data.

The U.S. Pat. No. 3,689,902 to Chang et al and assigned to the assignee of the present invention, describes a random access organization having the following three operations; (a) destructive read or selective clear operation that permits any individual loop to be cleared selectively and then rewritten; (b) a write operation that writes new data into a selected loop; and (c) a non-destructive read operation that reads non-destructively the data in any selected loop. This organization has the advantage of being able to rewrite a specific individual loop without clearing the entire memory. A write operation, however, consumes more time than a read operation.

The U.S. Pat. No. 3,991,411 to George describes a random access organization having a destructive read or selective clear operation, a non-destructive read operation and a write operation. In this organization, only one decoder is required in place of the separate read and write decoders shown in the aforementioned Chang et al patent. This organization requires separate controls for significantly fewer conductors and its write operation is more time consuming than its read operation.

While the aforementioned organizations are suitable for certain applications, these organizations are not suitable for intermixed read and write, read/modify/write and for swap operations. Intermixed read and write operations permit one to search records, by reading in a non-destructive manner, and then to switch between reading and writing in the middle of a loop. Read/modify/write operations permit one to read in a destructive manner, modify the byte that has been read and then write the modified byte in place of the original. A swap is a special case of the read/modify/write operation and permits reading of one block of data in storage and replacing it by writing a new block of data.

BRIEF DESCRIPTION OF THE DRAWINGS

In the accompanying drawings forming a material part of this disclosure.

DISCLOSURE OF THE INVENTION

For a further understanding of the invention, and of the objects and advantages thereof, reference will be had to the following description and accompanying drawings, and to the appended claims in which the various novel features of the invention ae more particularly set forth.

The random access bubble memory includes a plurality of bubble generators which direct a plurality of continuous streams of bubbles toward a plurality of storage loops. A write decoder selects one continuous stream of bubbles and has annihilators therein which destroy the other continuous streams of bubbles. An annihilator switch then transforms this one continuous stream of bubbles into the desired data pattern. This data pattern is then directed to a selected storage loop. A read decoder for this selected storage loop directs the data which had been stored therein to a sensor which detects the presence or absence of bubbles. Preferably, the distance between the write decoder and the annihilator switch that forms the data pattern is the same as the distance between the read decoder and the bubble sensor. It is also preferred that the distance between the write decoder and the input point of the storage loop is the same distance as from the read decoder deselected output to the input point of the storage loop. This memory has a unified read/write cycle which permits intermixed read and write, read/modify/write, and swap operations. This bubble memory allows a user to remove power abruptly during a read/write cycle without returning a partially processed block to its storage loop and without saving the identity of the block. In a preferred embodiment, the read and write decoders are operated simultaneously by identical control currents.

BEST MODE FOR CARRYING OUT THE INVENTION

Figure 1:
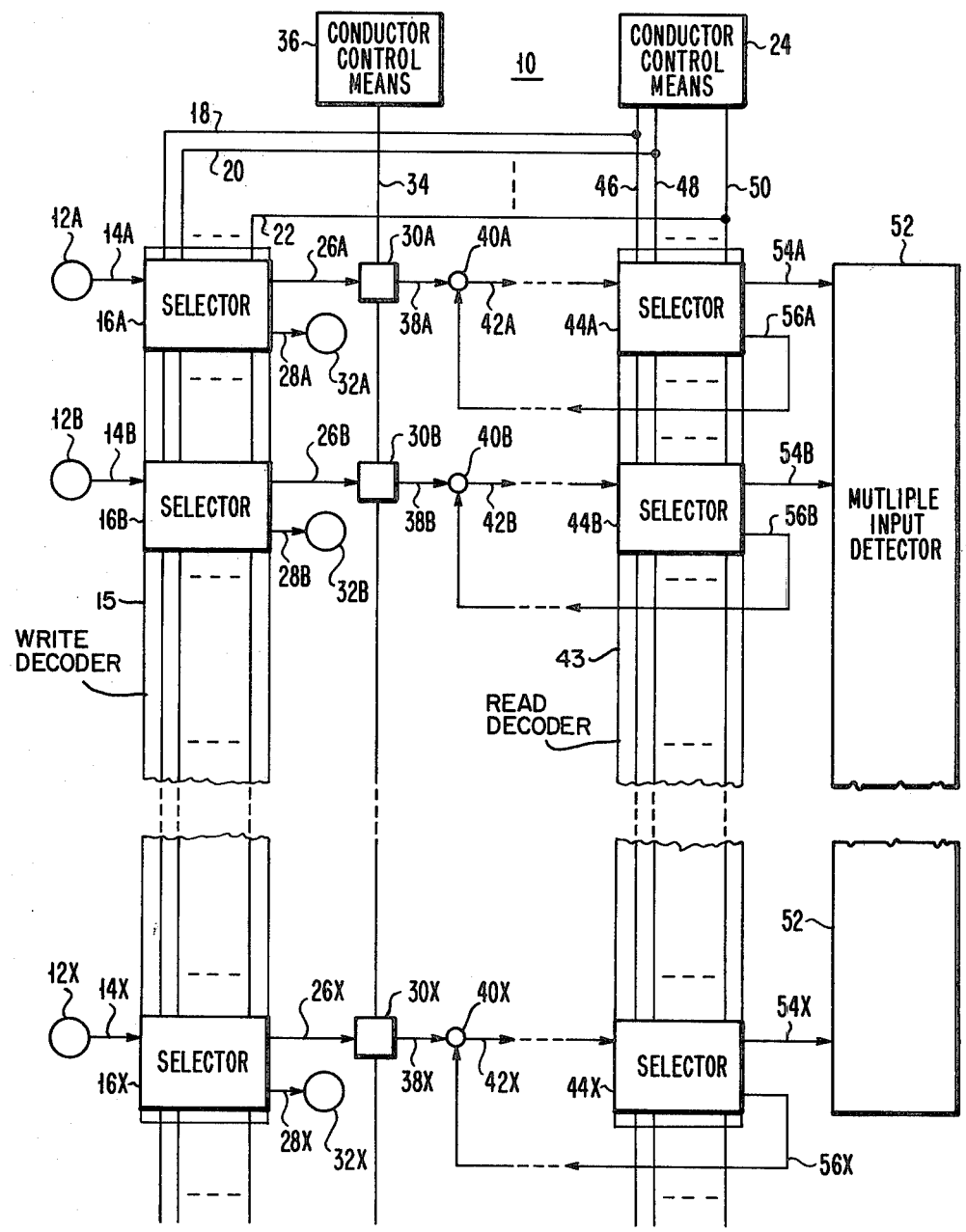
FIG. 1 is a schematic view of the random access bubble memory in accordance with this invention.

We first describe the random access memory organization according to the invention. Referring to FIG. 1, the memory system 10 has a plurality of bubble generators 12A, 12B, 12X which generate a continuous stream of bubbles on paths 14A, 14B and 14X which lead to a write decoder means 15 consisting of selectors 16A, 16B and 16X. Conductors 18, 20 and 22 are controlled by conductor control means 24 so that any write selector chosen by the control means 24 provides a continuous stream of bubbles at a selected output 26A, 26B or 26X and all other selectors direct input bubbles to a deselected output 28A, 28B or 28X. The stream of bubbles passing through the selected output 26A, 26B or 26X of the chosen selector is directed by annihilator switch 30A, 30B or 30X. Conductor 34 which passes through annihilator switches 30A, 30B and 30X is activated by conductor control means 36 to collapse bubbles therein so as to provide any desired data pattern on path 38A, 38B or 38X. All bubbles passing through deselected outputs 28A, 28B and 28X are annihilated by annihilators 32A, 32B and 32X.

Bubbles on paths 38A, 38B and 38X pass through merge or input points 40A, 40B and 40X respectively into the associated storage loops 42A, 42B and 42X. Read decoder means 43 consisting of read selectors 44A, 44B and 44X are associated with the storage loops 42A, 42B and 42X. Conductors 46, 48 and 50 may be activated by conductor control means 24 so that data in a chosen loop 42A, 42B and 42X will be routed by read selector 44A, 44B or 44X through selected output 54A, 54B or 54X directly to the multiple input detector 52. Data from loops 42A, 42B and 42X that does not pass through selected outputs 54A, 54B and 54X is routed by selectors 44A, 44B and 44X through deselected outputs 56A, 56B and 56X into the same storage loops.

The lengths of the propagation paths are adjusted so as to permit a unified read/write cycle. Specifically, the length of the paths from all selected outputs 54A, 54B and 54X of read selectors 44A, 44B and 44X to the sensor element (not shown) of detector 52 must equal the length of the path from selected outputs 26A, 26B, 26X of write selectors 16A, 16B and 16X to their respective annihilator switches 30A, 30B and 30X that form the data pattern.

Also, the length of the paths from the deselected outputs 56A, 56B and 56X of read selectors 44A, 44B and 44X to their respective merge or input points 40A, 40B and 40X must equal the length of the path from the selected outputs 26A, 26B and 26X of write selectors 16A, 16B and 16X to the same merge points.

The memory organization in FIG. 1 permits a unified read/write cycle from which all of the desired operations, that is, destructive read, non-destructive read, write, simultaneous clear and write, intermixed read and write, read/modify/write, and swap can be achieved. With this organization, a random access bubble memory is provided that has a write operation that is not more time consuming than a read operation.

INDUSTRIAL APPLICABILITY

Figure 2A:
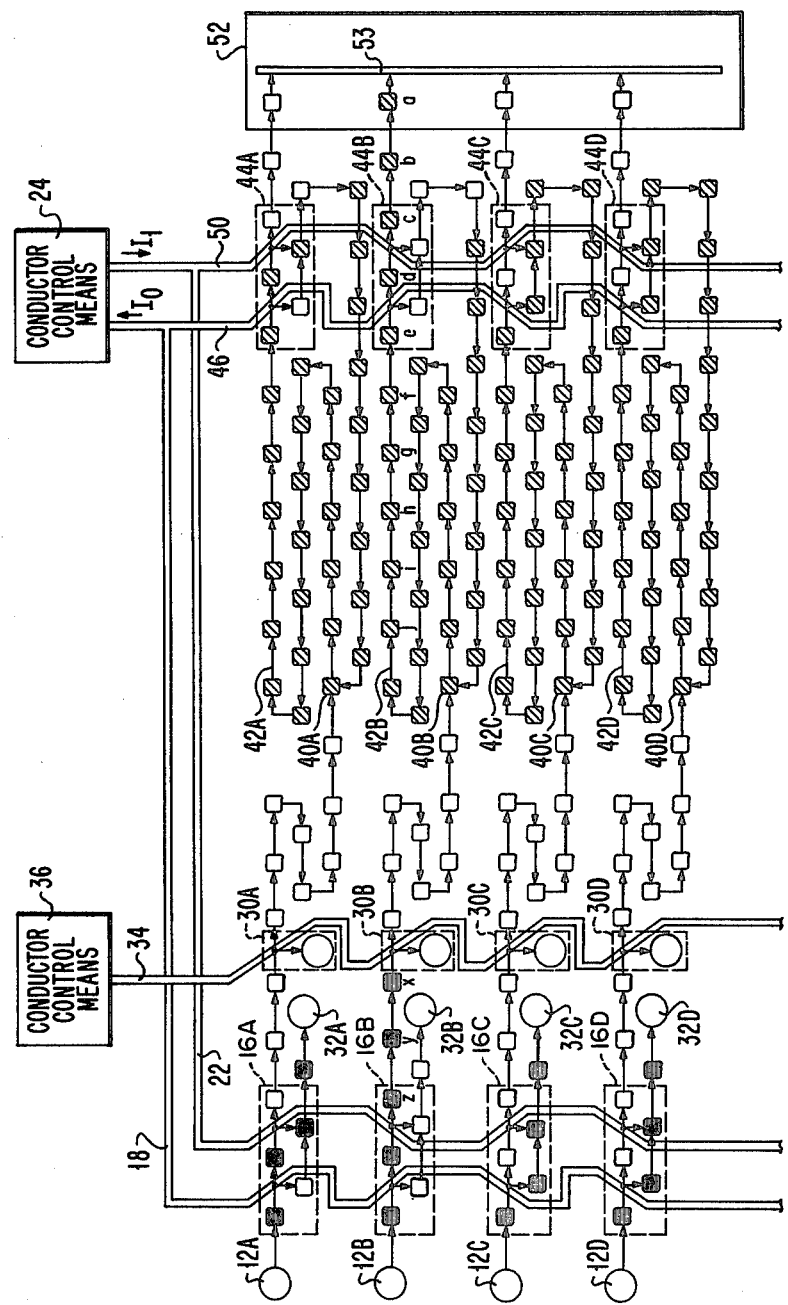
FIGS. 2A–C illustrate a specific example of the mode of operation in accordance with this invention.
Figure 2B:
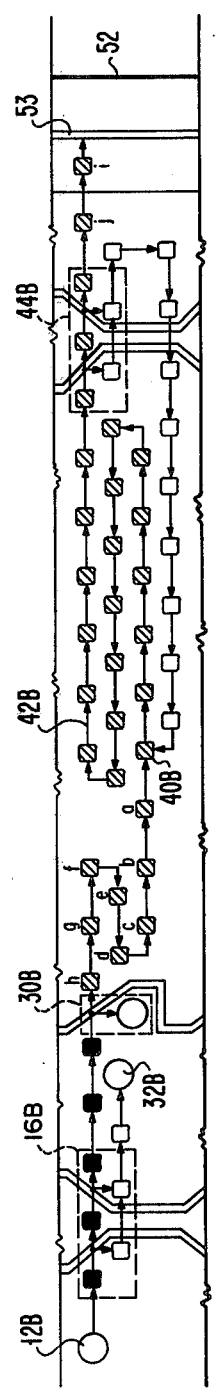
Figure 2C:
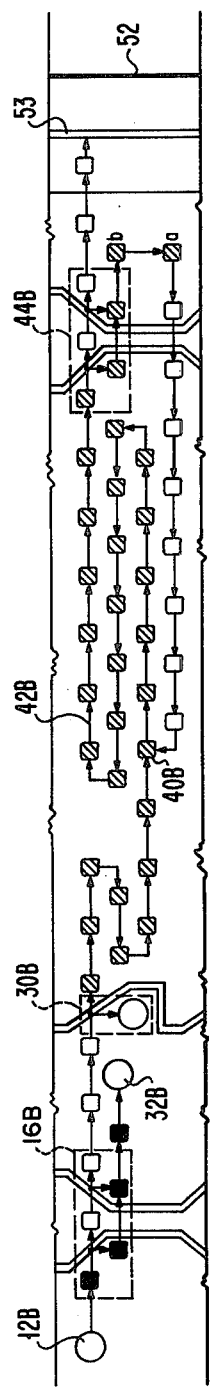

An example of the industrial applicability is the specific implementation of the random access organization shown in FIGS. 2A-2C. The numbering of the component parts in 2A-2C is substantially the same as in FIG. 1. Each of the squares in FIG. 2A-2C represents a permalloy site capable of retaining a bubble. Squares that are colored black contain bubbles; squares that are shaded contain data; and clear squares are unoccupied.

Bubbles are generated in generators 12A, B, C and D and pass into the selectors 16A, B, C and D respectively. Selectors 16A, C and D direct the bubbles through the deselected outputs to bubble annihilators 32A, 32C and 32D respectively. Selector 14B directs the bubbles through the selected output across two bit positions to the annihilator switch 30B as shown in FIG. 2A. Data is present in the four storage loops 42A, 42B, 42C and 42D, each loop containing 32 bits. Conductor control means 36 and conductor control means 24 control the write selectors 16A-D, the annihilator switches 30A-30D and the read selectors 44A-44D. The merge point 40A, B, C, D are the points at which the bubbles enter the storage loops 42A, B, C and D. Detector 52 contains sensing means 53. There are two bit positions between the read selectors 44A-D and the sensor means 53. There are 11 bit positions between the write selectors 16A-D and the merge points 40A-D. There are also 11 bit positions between the read selectors 44A-D and the merge points 40A-D.

FIGS. 2A-2C illustrate the unified read/write cycle permitted with this organization. A unified read/write cycle is defined to mean that the same sequence of drive field rotations and control currents for both read and write selectors are used to read and/or write a loop of data.

FIG. 2A illustrates the situation after storage loop 42B has been selected for 3 drive field rotations. Accordingly, read selector 44B has directed three data bits a, b and c as shown toward sensor 53. Similarly, write selector 16B has directed three bubbles x, y and z as shown toward annihilator 30B.

FIG. 2B illustrates the position of the data bits after eight drive field rotations during which annihilator 30B reproduces data bits, a, b, c, d, e, f, g and h. These data bits were originally in the minor loop 42B and were directed from the read selector 44B through the selected output path to detector 52 and were sensed by sensor 53. During the next drive field rotation, data bit i will first be sensed by sensor 53 and then it may be reproduced by annihilator switch 30B. Alternatively, instead of reproducing data bit i, annihilator switch 30B can replace data bit i with new data bit i'. Thus, it is feasible to intermix read and write operations during the same read/write cycle. Additionally, new data bit i' may be dependent on data bit i if a read/modify/write operation is desired.

FIG. 2C illustrates the position of the data bits after the read/write cycle for loop 42B has been completed. The write selector 14B now directs the continuous stream of bubbles to the annihilator 32B. The number of data bits between the annihilator switch 30B and the merge point 40B is the same as the number of vacancies in the storage loop 42B.

This organization allows a user to remove power abruptly during a read/write cycle without returning a partially processed block to its storage loop and without saving the identity of the block. For example, suppose that the power is removed when the memory is in the situation shown in FIG. 2A. For every data bit a, b and c, outside of the minor loop that is to be read, there is a corresponding bubble x, y, z on the path leading to the annihilator which generates the data bits for that loop. Thus, when the power is turned on, the control means 36 can be operated to cause the appropriate annihilator switch, 30B in this case, to reproduce data bits a, b and c from bubbles x, y and z. Hence this organization allows one to restore all data to the proper minor loop without knowing which particular minor loop is involved.

If the memory is to be non-volatile, then some provision must also be made for retaining the rotational position of the bits in each loop. One example would be to set aside a single loop for timing information.

While I have illustrated and described the preferred embodiment of my invention, it is understood that I do not limit myself to the precise constructions herein and the right is reserved to allow changes and modifications coming within the scope of the invention as defined in the appended claims.

Having thus described my invention, what I claim as new, and desire to secure by Letters Patent is:

1. A memory system for magnetic bubble domains in a magnetic sheet comprising:
   generator means for producing a plurality of continuous streams of bubbles;
   storage loop means for the storage of bubbles including a plurality of storage loops;
   write decoder means adapted to select one of said storage loops toward which a first continuous stream of bubbles is to be directed;
   annihilator means associated with said write decoder means and adapted to destroy all continuous streams of bubbles other than said first continuous stream,
   annihilator switch means associated with said write decoder means and adapted to transform said first continuous stream of bubbles from said write decoder means into a data pattern;
   read decoder means associated with said storage loop means and adapted to select the storage loop from which the bubbles are to be removed;
   conductor control means for activating said write decoder means and said read decoder means to select the same storage loop; and
   sensing means for detection of bubbles from said read decoder means.

2. A memory system as described in claim 1 including means for supplying control currents simultaneously to said write decoder means and said read decoder means.

3. A memory system as described in claim 1 wherein the distance between write decoder means and said annihilator switch means is the same as the distance between the read decoder means and the sensing means.

4. A memory system as described in claim 1 wherein said storage loop means has an input point for each loop and wherein said read decoder means has a selected output for each loop through which bubbles go to the sensing means and a deselected output where bubbles go back into the storage loop, the distance between said write decoder means and the input point of a storage loop is the same distance as from the read decoder deselected output to the input point of the loop.

5. A memory system for magnetic bubble domains in a magnetic sheet comprising:
   generator means for producing a plurality of continuous streams of bubbles;
   write decoder means adapted to select a first continuous stream of bubbles;
   annihilator means associated with said write decoder means and adapted to destory all continuous streams of bubbles other than said first continuous stream;
   annihilator switch means associated with said write decoder means and adapted to transform said first continuous stream of bubbles into a data pattern;
   storage loop means for storage of bubbles from said annihilator switch means, said storage loop means having an input point for each loop;
   read decoder means associated with said storage loop means and adapted to select the storage loop from which the bubbles are to be removed, said read decoder means having a selected output for each loop through which bubbles go to the sensing means and a deselected output through which bubbles go back into the storage loop, and wherein the distance from the read decoder deselected output to the input point of the loop is the same as the distance between said write decoder means and the input point of a storage loop; and
   sensing means for detection of bubbles from said read decoder means wherein the distance between the read decoder means and the sensing means is the same as the distance between write decoder means and said annihilator switch means.

6. A memory system as described in claim 5 including means for supplying control currents simultaneously to said write decoder means and said read decoder means.

7. A memory system as described in claim 5 wherein said write decoder means contains a plurality of selectors.

8. A memory system as described in claim 5 wherein said read decoder means contains a plurality of selectors.

* * * * *